(12) United States Patent
Nakayama

(10) Patent No.: US 10,256,355 B2
(45) Date of Patent: Apr. 9, 2019

(54) PHOTOELECTRIC CONVERTER WITH A MULTI-LAYERED QUANTUM DOT FILM

(71) Applicant: KYOCERA Corporation, Kyoto-shi, Kyoto (JP)

(72) Inventor: Toru Nakayama, Fukuoka (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 0 days.

(21) Appl. No.: 15/755,196

(22) PCT Filed: Aug. 26, 2016

(86) PCT No.: PCT/JP2016/075030
§ 371 (c)(1),
(2) Date: Feb. 26, 2018

(87) PCT Pub. No.: WO2017/038698
PCT Pub. Date: Mar. 9, 2017

(65) Prior Publication Data
US 2018/0240921 A1    Aug. 23, 2018

(30) Foreign Application Priority Data

Aug. 28, 2015   (JP) ................................. 2015-169294

(51) Int. Cl.
*H01L 31/074* (2012.01)
*H01L 31/0352* (2006.01)
(Continued)

(52) U.S. Cl.
CPC .. *H01L 31/035236* (2013.01); *H01L 31/0352* (2013.01); *H01L 31/074* (2013.01);
(Continued)

(58) Field of Classification Search
CPC ......... H01L 31/035236; H01L 31/0352; H01L 31/074; B82Y 30/00
See application file for complete search history.

(56) References Cited

U.S. PATENT DOCUMENTS

2011/0079765 A1* 4/2011 Soma ................... H01L 31/0352
257/13
2011/0146775 A1   6/2011 Kim et al.
(Continued)

FOREIGN PATENT DOCUMENTS

JP    2011-121862 A    6/2011
JP    2011-249579 A   12/2011
(Continued)

OTHER PUBLICATIONS

International Search Report (PCT/ISA/210) dated Nov. 29, 2016, issued in PCT/JP2016/075030.
(Continued)

*Primary Examiner* — Allen L Parker
*Assistant Examiner* — Gustavo G Ramallo
(74) *Attorney, Agent, or Firm* — Volpe and Koenig, P.C.

(57) ABSTRACT

A photoelectric converter includes two semiconductor layers forming a p/n junction as a photoelectric conversion layer. At least one semiconductor layer of the two semiconductor layers is a quantum dot integrated film, and the quantum dot integrated film includes two or greater quantum dot layers having different energy levels. In a case that the quantum dot integrated film is a p-type, a quantum dot layer having a large difference between an energy level ($B_v$) of a valence band and a Fermi level ($E_f$) is disposed closer to a p/n junction surface.

10 Claims, 7 Drawing Sheets

(51) Int. Cl.
 *B82Y 30/00* (2011.01)
 *B82Y 20/00* (2011.01)
(52) U.S. Cl.
 CPC ............ *B82Y 20/00* (2013.01); *B82Y 30/00* (2013.01); *Y02E 10/50* (2013.01)

(56) References Cited

U.S. PATENT DOCUMENTS

| | | | |
|---|---|---|---|
| 2011/0290310 A1 | 12/2011 | Kuramachi et al. | |
| 2011/0290311 A1 | 12/2011 | Fukada | |
| 2016/0276507 A1 | 9/2016 | Kanakura et al. | |
| 2017/0138567 A1* | 5/2017 | Yoon ..................... | C09K 11/08 |

FOREIGN PATENT DOCUMENTS

| | | |
|---|---|---|
| JP | 2012-501536 A | 1/2012 |
| JP | 2013-229378 A | 11/2013 |
| JP | 2014-165198 A | 9/2014 |
| WO | 2010089892 A1 | 8/2010 |
| WO | 2015076300 A1 | 5/2015 |

OTHER PUBLICATIONS

Written Opinion (PCT/ISA/237) dated Nov. 29, 2016, issued in PCT/JP2016/075030.

* cited by examiner

PHOTOELECTRIC CONVERTER WITH A MULTI-LAYERED QUANTUM DOT FILM

TECHNICAL FIELD

The present disclosure relates to a photoelectric converter.

BACKGROUND ART

Development of solar cells as a clean energy source that provides energy and resource savings is actively progressing. Photoelectric converters such as solar cells are power devices that utilize the photovoltaic effect to convert light energy directly into electric power. In recent years, based on the anticipation that a conversion efficiency of 60% or greater can be theoretically achieved, photoelectric converters using integrated films in which semiconductive nanoparticles (quantum dots) are integrated as photoelectric conversion layers have been considered as next-generation photoelectric converters (for example, Patent Literature 1 to 4).

Incidentally, as can be understood from the examples of Patent Literature 1 to 4, in photoelectric converters disclosed up to this point, the photoelectric conversion layer has a configuration made up of quantum dots having the same shape.

CITATION LIST

Patent Literature

Patent Literature 1: JP 2013-229378 A
Patent Literature 2: JP 2011-249579 A
Patent Literature 3: JP 2011-121862 A
Patent Literature 4: WO 2010/089892

SUMMARY OF INVENTION

The present disclosure relates to the recognition that by controlling the band structure of quantum dots included in a semiconductor layer constituting the photoelectric conversion layer and applying a change to energy levels in the photoelectric conversion layer, the mobility of generated carriers (electrons e, holes h) can be improved. A photoelectric converter is configured including two semiconductor layers forming a p/n junction as a photoelectric conversion layer. At least one semiconductor layer of the two semiconductor layers is a quantum-dot integrated film, and the quantum dot integrated film includes two or greater quantum dot layers having different energy levels.

DESCRIPTION OF EMBODIMENTS

In cases where the photoelectric conversion layer is occupied by quantum dots having the same band structure as in the known photoelectric converter described above, the energy levels formed in the photoelectric conversion layer have almost no inclination in the thickness direction of the photoelectric conversion layer, and the mobility of carriers generated in the semiconductor layer is low. As a result, the carrier collection efficiency is low, and an improvement in the photoelectric conversion efficiency cannot be expected.

Figure 1A:
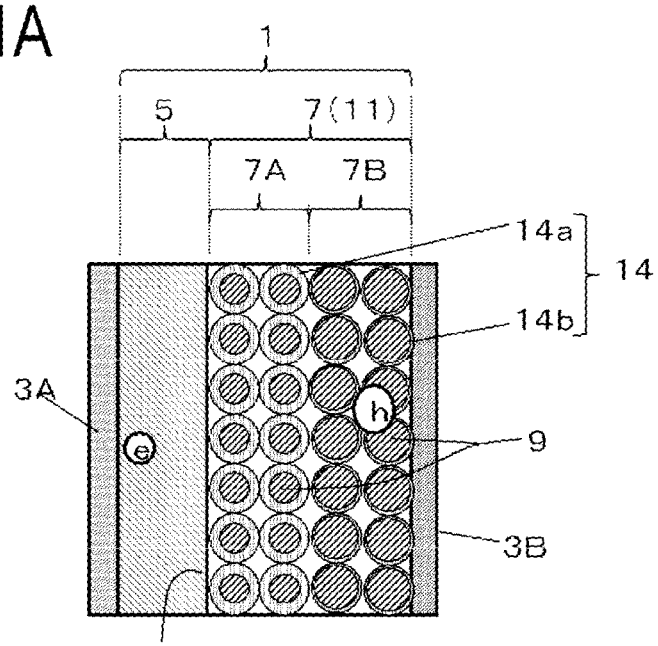
FIG. 1A is a schematic cross-sectional view partially illustrating a photoelectric converter according to a first embodiment of the present disclosure, where the semiconductor layer including quantum dots is p-type, and the thickness of the barrier layer surrounding the quantum dots is modified.
Figure 1B:
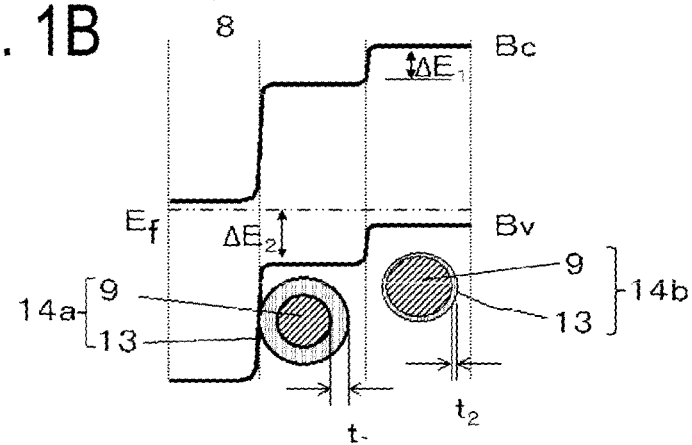
FIG. 1B is a schematic diagram illustrating the energy levels in the photoelectric converter of FIG. 1A.

FIG. 1A is a schematic cross-sectional view partially illustrating a photoelectric converter according to a first embodiment of the present disclosure, where the semiconductor layer including quantum dots is p-type, and the thickness of the barrier layer surrounding the quantum dots is modified. FIG. 1B is a schematic diagram illustrating the energy levels in the photoelectric converter of FIG. 1A. In FIG. 1A and FIG. 1B, the semiconductor layer 5 is n-type and the semiconductor layer 7 is p-type. In addition, the symbol $E_f$ (denoted by an alternate long and two short dashed line) is a Fermi level, $B_C$ (denoted by a solid line) is the energy level of the conduction band, and $B_V$ (denoted by a solid line) is the energy level of the valence band. As illustrated in FIG. 1B, the energy level $B_V$ of the valence band and the energy level $B_C$ of the conduction band change such that the energy levels in the semiconductor layer 7 including the quantum dots 9 become higher than the energy levels in the semiconductor layer 5.

In the photoelectric converter (for example, a solar cell) illustrated in FIG. 1A and FIG. 1B, the photoelectric conversion layer 1 includes electrode layers 3A and 3B on both sides thereof. In the photoelectric conversion layer 1, the two semiconductor layers 5 and 7 forms a p/n junction, and in this case, the interface denoted by reference numeral 8 indicates a p/n junction surface.

Among the semiconductor layers 5 and 7 that constitute the photoelectric conversion layer 1, for example, the semiconductor layer 7 illustrated in FIG. 1A is the quantum dot integrated film 11.

The quantum dot integrated film 11 is formed by quantum dot composite particles 14, each including a barrier layer 13 around the quantum dot 9. In this case, the quantum dot integrated film 11 has a configuration in which two kinds of quantum dot composite particles 14a and 14b having different thicknesses of the barrier layer 13 are layered. This allows the semiconductor layer 7 which serves as the quantum dot integrated film 11 to have a structure in which two quantum dot layers 7A and 7B having different energy levels are layered.

In the photoelectric converter according to the first embodiment, as the thickness t of the barrier layer 13 constituting the quantum dot composite particles 14 (14a and 14b) differs between the two quantum dot layers 7A, 7B constituting the semiconductor layer 7, as illustrated in FIG. 1B, a difference occurs in the energy levels (reference symbol $\Delta E_1$ in FIG. 1B) that change one-dimensionally in the photoelectric conversion layer 1 as a result of the difference in surface energy due to the difference in thickness t of the barrier layer 13.

This allows the photoelectric converter of the first embodiment to form an inclination for the energy band such that the energy level increases from the quantum dot layer 7A disposed closer to the p/n bonding surface 8 to the quantum dot layer 7B farther from the p/n junction surface 8 in the semiconductor layer 7. That is, when the quantum dot integrated film 11 is p-type, a quantum dot layer (7A, in this case) having a large difference between the energy level $B_V$ of the valence band and the Fermi level $E_f$ is disposed closer to the p/n bonding surface 8.

As a result, carriers (electrons e, holes h) having different polarities formed in the photoelectric conversion layer 1 may be easily moved in the respective directions of the electrode layers 3A and 3B, whereby the collection efficiency of carriers in the electrode layers 3A and 3B improves, and the photoelectric conversion efficiency can be enhanced. Hereinafter, similar effects can be obtained for the photoelectric converters of the second embodiment to the eighth embodiment.

Here, the statement that the thickness t of the barrier layer 13 constituting the quantum dot composite particles 14 differs refers to a case in which, when a comparison is made between the one with the thicker average thickness of the barrier layer 13 between the quantum dot layers 7A and 7B taken as $t_1$ and the one with the lesser average thickness taken as $t_2$, the average thickness ratio $t_1/t_2$ is 1.5 or greater.

At this time, from the viewpoint that the mobility of the carriers (electrons e, holes h) in the photoelectric conversion layer 1 can be increased, it is preferable that no members other than the quantum dot composite particles 14 exist at the boundary between the quantum dot layer 7A and the quantum dot layer 7B. This similarly applies to the photoelectric converters of other embodiments described below.

The average thicknesses $t_1$ and $t_2$ of the barrier layer 13 are obtained by observing, for example, 5 to 20 quantum dot composite particles 14 existing in a predetermined range in each region of the quantum dot layers 7A and 7B, extracting a portion in each quantum dot composite particle 14 where the thickness of the barrier layer 13 is maximum, and acquiring the average value thereof.

The photoelectric converter of the first embodiment can be realized by specifically applying the following members. For example, a semiconductor material including silicon or zinc oxide as a main component is suitable for the semiconductor layer 5. In this case, when silicon is used for the semiconductor layer 5, a material including an n-type doping component is utilized. In contrast, at least one of silicon, lead sulfide (PbS), or indium phosphide can be used for the quantum dots 9 that constitute the semiconductor layer 7 (quantum dot integrated film 11).

Either an inorganic material or an organic material can be applied to a material of the barrier layer 13. In this case, in a case where an inorganic material is utilized for the barrier layer 13, a photoelectric converter having a high degree of weather resistance can be obtained. In contrast, in a case where an organic material is applied to the barrier layer 13, since the thickness of the barrier layer 13 can be modified by the molecular weight of the organic material, it is easy to control the band gap between the quantum dot layers 7A and 7B. This allows a quantum dot integrated film 11 (semiconductor layers 7A and 7B) having a high carrier confinement effect to be formed. Here, silicon carbide, silicon dioxide and zinc sulfide may be suitable as the inorganic material of the barrier layer 13, and tetrabutylammonium iodide (TBAI) or 1,2-ethanedithiol (EDT) may be used as the organic material.

Figure 2A:
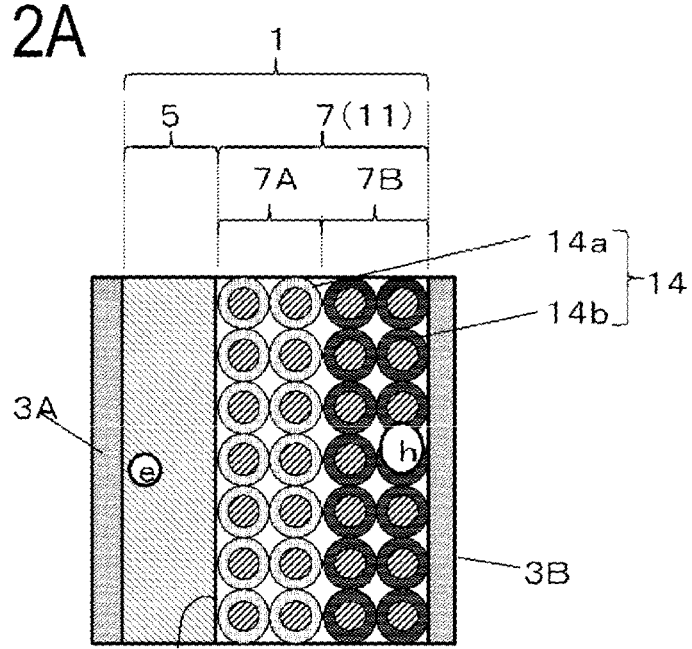
FIG. 2A is a schematic cross-sectional view partially illustrating a photoelectric converter according to a second embodiment of the present disclosure, where the semiconductor layer including quantum dots is p-type, and the components of the barrier layer surrounding the quantum dots are modified.
Figure 2B:
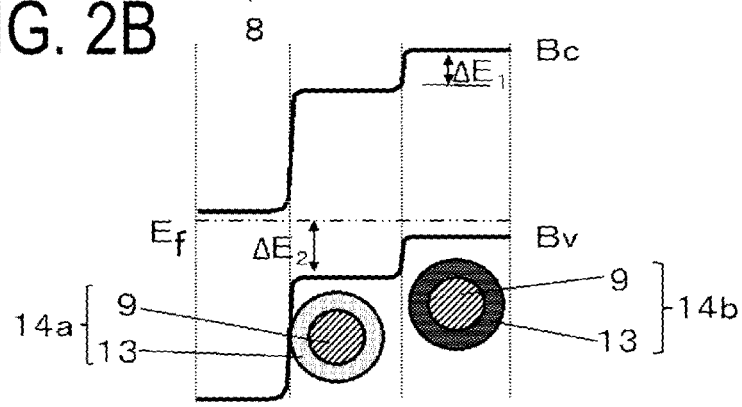
FIG. 2B is a schematic diagram illustrating the energy levels in the photoelectric converter of FIG. 2A.

FIG. 2A is a schematic cross-sectional view partially illustrating a photoelectric converter according to a second embodiment of the present disclosure, where the semiconductor layer including quantum dots is p-type, and the components of the barrier layer surrounding the quantum dots are modified. FIG. 2B is a schematic diagram illustrating the energy levels in the photoelectric converter of FIG. 2A.

With the exceptions that the thickness of the barrier layers 13 are the same and that the components of the barrier layer 13 provided around the quantum dots 9 are different, the photoelectric converter of the second embodiment illustrated in FIG. 2A and FIG. 2B has the same configuration as the photoelectric converter of the first embodiment illustrated in FIG. 1A and FIG. 1B.

In the photoelectric converter of the second embodiment, by making the components of the barrier layer 13 provided around the quantum dots 9 different between the quantum dot layers 7A and 7B, the surface energy of the quantum dot composite particles 14 is modified, and as illustrated in FIG. 2B, a difference in energy levels (reference symbol $\Delta E_1$ in FIG. 2B) which changes one-dimensionally in the photoelectric conversion layer 1 is generated.

This allows an inclination of the energy band to be formed in the semiconductor layer 7 such that the energy level becomes higher from the quantum dot layer 7A to the quantum dot layer 7B.

With regard to materials for making the photoelectric converter of the second embodiment, it is preferable that the semiconductor material that serves as the semiconductor layer 5 and the quantum dots 9 constituting the semiconductor layer 7 (quantum dot integrated film 11) have the same configuration as in the case of the first embodiment, but for the material of the barrier layer 13, the TBAI, which is an organic material, can be applied to the quantum dot composite particles 14 in the quantum dot layer 7A, and the EDT, which is also an organic material, can be applied to the quantum dot composite particles 14 in the quantum dot layer 7B.

Figure 3A:
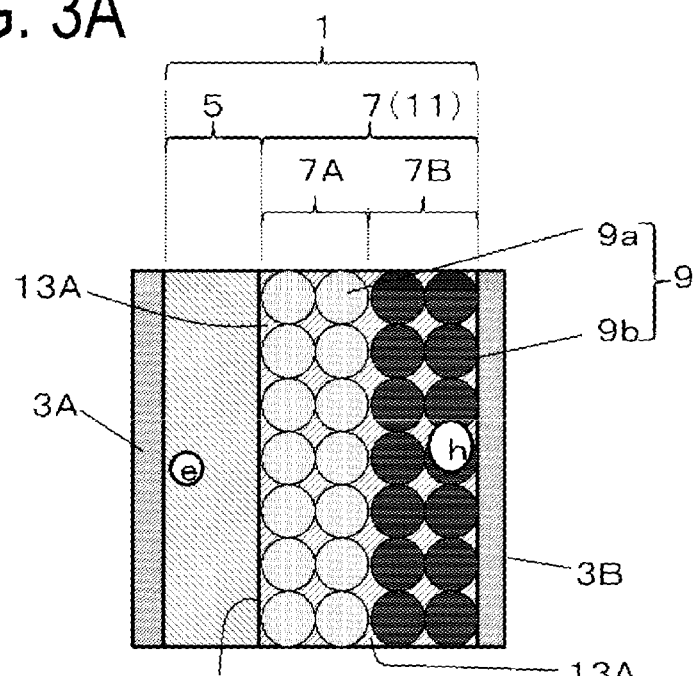
FIG. 3A is a schematic cross-sectional view partially illustrating a photoelectric converter according to a third embodiment of the present disclosure, where the semiconductor layer including the quantum dots is p-type, and the doping components included in the quantum dots are modified.
Figure 3B:
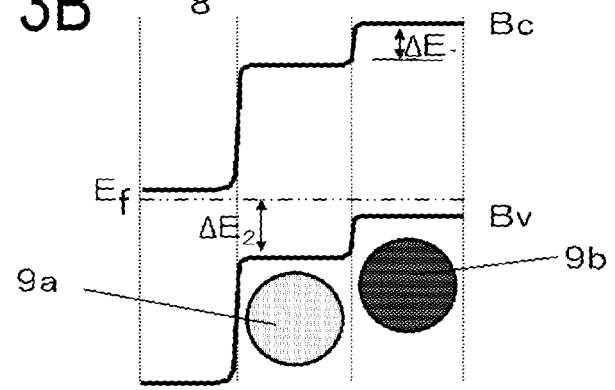
FIG. 3B is a schematic diagram illustrating the energy levels in the photoelectric converter of FIG. 3A.

FIG. 3A is a schematic cross-sectional view partially illustrating a photoelectric converter according to a third embodiment of the present disclosure, where the semiconductor layer including the quantum dots is p-type, and the doping components included in the quantum dots are modified. FIG. 3B is a schematic diagram illustrating the energy levels in the photoelectric converter of FIG. 3A.

The quantum dot integrated film 11 that constitutes the photoelectric converter of the third embodiment is not formed as what is known as a core-shell structure as illustrated in FIGS. 1A and 1B and FIGS. 2A and 2B in which the barrier layer 13 is provided around individual quantum dots 9 (9a, 9b), but instead, as a representative example, has a structure in which the material that serves as the barrier layer 13 is a matrix 13A, and the quantum dots 9 (9a, 9b) are included in the matrix 13A. Except for this, the photoelectric converter has the same configuration as the photoelectric converter of the first embodiment illustrated in FIG. 1A.

In the photoelectric converter of the third embodiment, by modifying the acceptor type doping component (element) or the concentration of the doping component included in the quantum dots 9 (9a, 9b), a difference can be created in the surface energy of the quantum dots 9 between the quantum dot layers 7A and 7B. This allows, as illustrated in FIG. 3B, an inclination of the energy band to be formed in the semiconductor layer 7 such that the energy level becomes higher from the quantum dot layer 7A to the quantum dot layer 7B.

With regard to materials for making the photoelectric converter of the third embodiment, it is preferable that the semiconductor material that serves as the semiconductor layer 5 and the quantum dots 9 (9a, 9b) that constitute the semiconductor layer 7 (quantum dot integrated film 11) have the same configuration as in the case of the first embodiment. In contrast, with regard to the semiconductor layer 7 (quantum dot integrated film 11), when silicon is applied to the quantum dots 9 (9a, 9b), elements of Group 12 and Group 13 of the periodic table can be applied as doping components. In this case, a configuration is preferable in which the quantum dots 9a that constitute the quantum dot layer 7A are made to include a large number of elements belonging to Group 13 (any one of B, Al, Ga, or In), and the other quantum dots 9b that constitute the quantum dot layer 7B are made to include a large number of elements belonging to Group 12 (for example, any one of Zn, Cd, or Hg).

In addition, when indium phosphide is applied to the quantum dots 9 (9a, 9b), a configuration is preferable in which, for example, the quantum dots 9a are made to include a large number of elements belonging to Group 14 (Sn), and the other quantum dots 9b that constitute the quantum dot layer 7B are made to include a large number of elements belonging to Group 7, Group 11, and Group 12 (for example, any one of Mn, Cu, or Zn).

In cases where the concentration of the doping components is modified between the quantum dot layers 7A and 7B, it may be desirable for the concentration of the doping components included in the quantum dot layer 7B to be made higher than the concentration of the doping components included in the quantum dot layer 7A.

In cases where the atomic valence of the doping components is modified between the quantum dot layers 7A and 7B, it may be desirable to use elements having different atomic valences as the doping components of the quantum dots 9a and 9b.

In this case as well, any of the above-described silicon carbide, silicon dioxide, tetrabutylammonium iodide (TBAI), or 1,2-ethanedithiol (EDT) may be suitable for the matrix 13A.

Figure 4A:
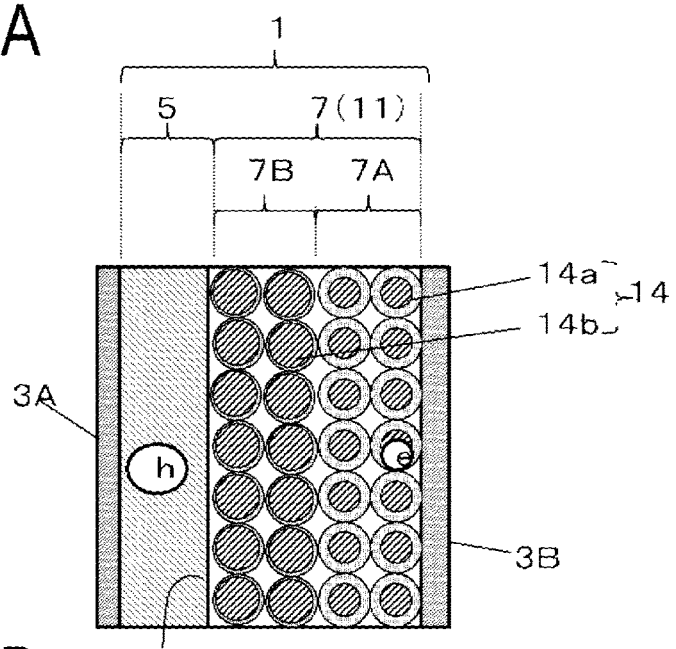
FIG. 4A is a schematic cross-sectional view partially illustrating a photoelectric converter according to a fourth embodiment of the present disclosure, where the semiconductor layer including quantum dots is n-type, and the thickness of the barrier layer surrounding the quantum dots is modified.
Figure 4B:
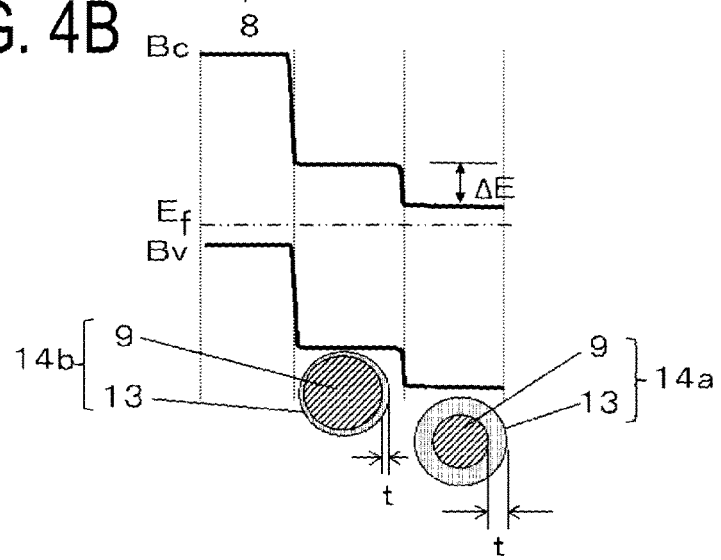
FIG. 4B is a schematic diagram illustrating the energy levels in the photoelectric converter of FIG. 4A.

FIG. 4A is a schematic cross-sectional view partially illustrating a photoelectric converter according to a fourth embodiment of the present disclosure, where the semiconductor layer including quantum dots is n-type, and the thickness of the barrier layer surrounding the quantum dots is modified. FIG. 4B is a schematic diagram illustrating the energy levels in the photoelectric converter of FIG. 4A.

In the photoelectric converter of the fourth embodiment illustrated in FIG. 4A and FIG. 4B, the semiconductor layer 5 is a p-type and the semiconductor layer 7 is n-type. In this case as well, as in FIGS. 1A and 1B, the interface denoted by reference numeral 8 is the p/n junction surface. In addition, the reference symbols $E_f$, $B_C$, and $B_V$ are the same as those illustrated in FIGS. 1A and 1B.

The photoelectric converter of the fourth embodiment illustrated in FIG. 4A and FIG. 4B differs from the photoelectric converter of the first embodiment illustrated in FIG. 1A and FIG. 1B in that the polarity of the semiconductor layer 5 and the semiconductor layer 7 is reversed, the semiconductor layer 5 is p-type, and the semiconductor layer 7 formed of the quantum dot integrated film 11 is n-type. In this case, the energy level $B_V$ of the valence band and the energy level $B_C$ of the conduction band change such that the energy levels in the semiconductor layer 5 become higher than the energy levels in the semiconductor layer 7 formed by the quantum dot integrated film 11, opposite to the case of FIG. 1B.

In the photoelectric conversion device of the fourth embodiment, the quantum dot composite particles 14 that constitute the quantum dot layer 7B closer to the semiconductor layer 5 have a lesser thickness of the barrier layer 13 than that of the quantum dot composite particles 14 that constitute the quantum dot layer 7A, and the quantum dot layer 7A has a greater increase in the Fermi level $E_f$ due to the barrier layer 13 than that in the quantum dot 7B. This allows an inclination of the energy band to be generated such that the energy level becomes lower from the quantum dot layer 7B to the quantum dot 7A.

Figure 5A:
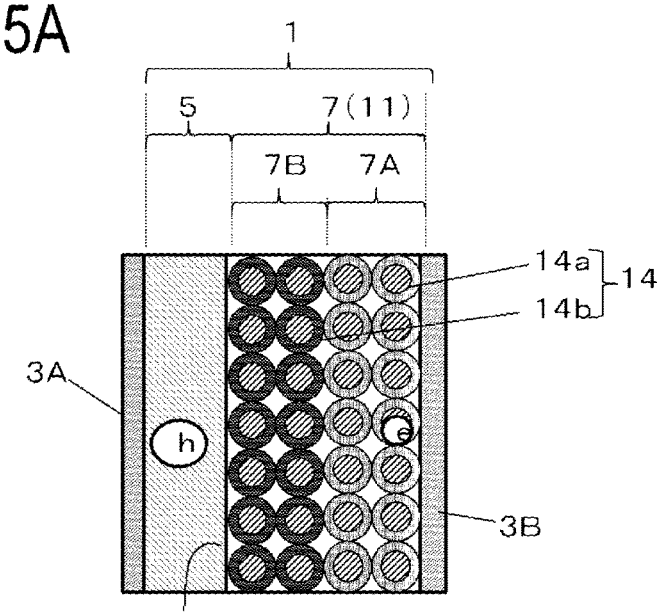
FIG. 5A is a schematic cross-sectional view partially illustrating a photoelectric converter according to a fifth embodiment of the present disclosure, where the semiconductor layer including quantum dots is n-type, and the components of the barrier layer surrounding the quantum dots are modified.
Figure 5B:
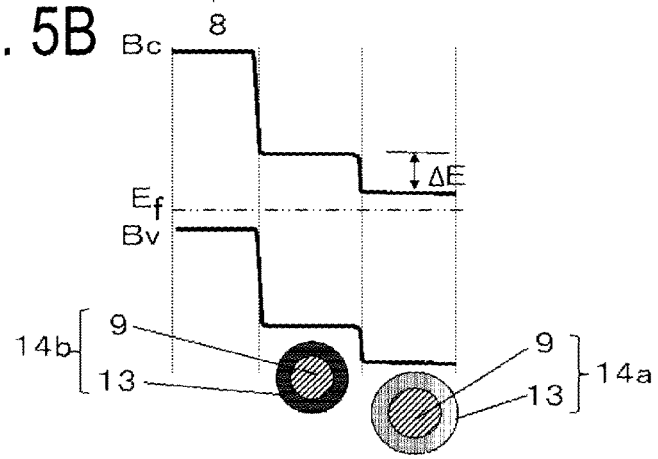
FIG. 5B is a schematic diagram illustrating the energy levels in the photoelectric converter of FIG. 5A.

FIG. 5A is a schematic cross-sectional view partially illustrating a photoelectric converter according to a fifth embodiment of the present disclosure, where the semiconductor layer including quantum dots is n-type, and the components of the barrier layer surrounding the quantum dots are modified. FIG. 5B is a schematic diagram illustrating the energy levels in the photoelectric converter of FIG. 5A.

Also, in the photoelectric converter of the fifth embodiment illustrated in FIG. 5A and FIG. 5B, similarly to the photoelectric converter of the fourth embodiment described above, the semiconductor layer 5 is p-type, the semiconductor layer 7 is n-type, and the interface denoted by reference numeral 8 is a p/n junction surface. In addition, reference symbols $E_f$, $B_C$ and $B_V$ also indicate the levels illustrated in FIG. 5B.

The photoelectric converter of the fifth embodiment illustrated in FIG. 5A and FIG. 5B differs from the photoelectric converter of the second embodiment illustrated in FIG. 2A and FIG. 2B in that the polarity of the semiconductor layer 5 and the semiconductor layer 7 is reversed, the semiconductor layer 5 is p-type, and the semiconductor layer 7 formed of the quantum dot integrated film 11 is n-type. In this case, the energy level By of the valence band and the energy level $B_C$ of the conduction band change such that the energy levels of the semiconductor layer 5 become higher than the energy levels of the semiconductor layer 7 formed by the quantum dot integrated film 11, opposite to the case of FIG. 2B.

In the photoelectric converter of the fifth embodiment, by making the components of the barrier layer 13 provided around the quantum dots 9 different, a difference is created in the surface energy of the quantum dot composite particles 14. This allows, as illustrated in FIG. 5B, a difference to occur in the energy levels (reference symbol $\Delta E_1$ in FIG. 2B) that change one-dimensionally in the photoelectric conversion layer 1. In this case, the barrier layer 13 has a configuration opposite to that of the photoelectric converter of the second embodiment in materials thereof. For example, EDT can be applied to the quantum dot composite particles 14 in the quantum dot layer 7A, and TBAI can be applied to the quantum dot composite particles 14 in the quantum dot layer 7B.

Figure 6A:
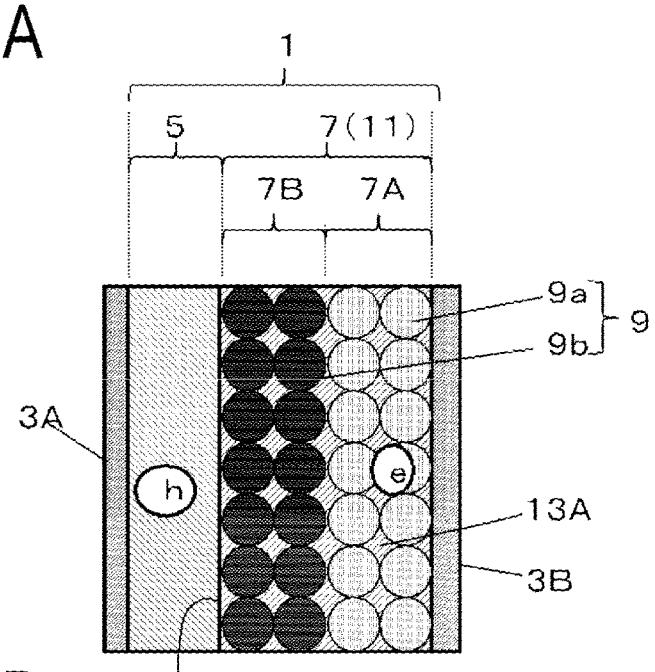
FIG. 6A is a schematic cross-sectional view partially illustrating a photoelectric converter according to a sixth embodiment of the present disclosure, where the semiconductor layer including the quantum dots is n-type, and the doping components included in the quantum dots are modified.
Figure 6B:
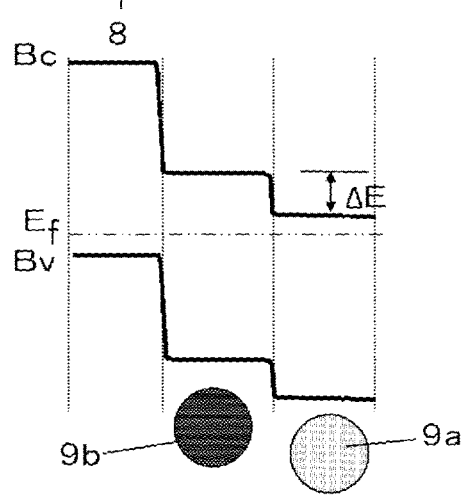
FIG. 6B is a schematic diagram illustrating the energy levels in the photoelectric converter of FIG. 6A.

FIG. 6A is a schematic cross-sectional view partially illustrating a photoelectric converter according to a sixth embodiment of the present disclosure, where the semiconductor layer including the quantum dots is n-type, and the doping components included in the quantum dots are modified. FIG. 6B is a schematic diagram illustrating the energy levels in the photoelectric converter of FIG. 6A.

In the photoelectric converter of the sixth embodiment illustrated in FIG. 6A and FIG. 6B, the semiconductor layer 5 is a p-type and the semiconductor layer 7 is an n-type. In this case as well, as in FIGS. 3A and 3B, the interface denoted by reference numeral 8 is the p/n junction surface. In addition, the reference symbols $E_f$, $B_C$, and $B_V$ are the same as those illustrated in FIGS. 3A and 3B.

The photoelectric converter of the sixth embodiment illustrated in FIG. 6A and FIG. 6B differs from the photoelectric converter of the third embodiment illustrated in FIG. 3A and FIG. 3B in that the polarity of the semiconductor layer 5 and the semiconductor layer 7 is reversed, the semiconductor layer 5 is p-type, and the semiconductor layer 7 formed of the quantum dot integrated film 11 is n-type. In this case, the energy level By of the valence band and the energy level $B_C$ of the conduction band change such that the energy levels of the semiconductor layer 5 become higher than the energy levels of the semiconductor layer 7 formed by the quantum dot integrated film 11, opposite to the case of FIG. 3B.

With respect to the photoelectric converter of the sixth embodiment as well, similar to the case of the photoelectric converter of the third embodiment described above, by modifying the doping component (donor type element) included in the quantum dots 9 (9a, 9b) or the concentration of the doping component, a difference can be created in the surface energy of the quantum dots 9 between the quantum dot layers 7A and 7B. This allows, as illustrated in FIG. 6B, an inclination of the energy band to be formed in the semiconductor layer 7 such that the energy level becomes higher from the quantum dot layer 7A to the quantum dot layer 7B.

In the case of the photoelectric converter of the sixth embodiment, regarding the semiconductor layer 7 (quantum dot integrated film 11), when silicon is applied to the quantum dots 9 (9a, 9b), elements of Group 15 and Group 16 of the periodic table can be applied as the doping components. In this case, a configuration is preferable in which the quantum dots 9a that constitute the quantum dot layer 7B include a large number of elements of Group 15 (any one of P, AS, or Sb), and the other quantum dots 9b that constitute the quantum dot 7A include a large number of elements of Group 16 (any one of S, Se, or Te).

In addition, when indium phosphide is applied to the quantum dots 9a and 9b, elements of each of Groups 7, 11, 12, and 14 of the periodic table can be applied as doping components.

In cases where the concentration of the doping components is modified between the quantum dot layers 7A and 7B, it is preferable that the concentration on the quantum dot layer 7B side is lower than that on the quantum dot layer 7A side.

Also, when changing the atomic valence of the doping components between the quantum dot layers 7A and 7B, elements having different atomic valences may be used as the doping components of the quantum dots 9a and 9b.

In addition, the photoelectric converter of the present embodiment can have the same configuration as that of the photoelectric converter of the third embodiment in the materials of the semiconductor layer 5 and the matrix 13A.

Herein, the photoelectric converters of the first embodiment to sixth embodiment have been described above, but with respect to the semiconductor layer 7 constituted by the quantum dot integrated film 11, a semiconductor layer 7 can be formed such that the semiconductor layer 7 includes three or greater quantum dot layers within a range in which the thickness t and components of the barrier layer 13, or alternatively the concentration or doping amount of the doping components included in the quantum dot 9, can be modified in multiple steps. Note that when the number of quantum dot layers disposed in the semiconductor layer 7 is three or greater, it is preferable that the quantum dot layer having the largest difference between the energy level $B_V$ of the valence band and the Fermi level $E_f$, or alternatively between the energy level $B_C$ of the conduction band and the Fermi level $E_f$ is placed closer to the p/n junction surface 8.

Next, a method of manufacturing the photoelectric converter of the present embodiment will be described with reference to FIGS. 7A to 7D. Here, the photoelectric converter of the first embodiment will be described as an example.

Figure 7A:
FIGS. 7A to 7D are processing diagrams illustrating a method of manufacturing the photoelectric converter of the first embodiment.

First, as illustrated in FIG. 7A, a transparent electrically conductive film 23 is formed on one main surface of a glass substrate 21 that serves as a support by using an electrically conductive material such as ITO as an electrode layer 3A.

Figure 7B:
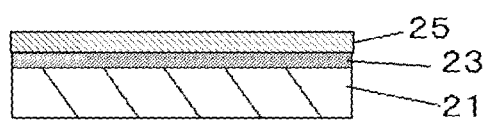

Next, as illustrated in FIG. 7B, a zinc oxide film 25 that serves as the semiconductor layer 5 is formed on the surface of the transparent electrically conductive film 23.

Figure 7C:
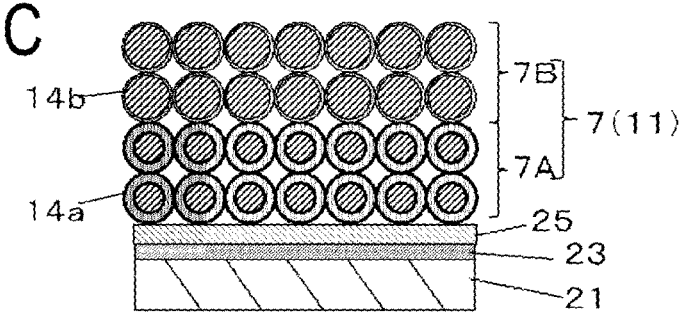

Next, as illustrated in FIG. 7C, quantum dot composite particles 14 having different thicknesses of the barrier layer 13 are film-formed on the surface of the zinc oxide film 25 in a layered manner to form the quantum dot integrated film 11 that serves as the semiconductor layer 7. Here, the quantum dot integrated film 11 can be densified by heating or pressurizing the quantum dot integrated film 11 or alternatively by performing heating and pressurizing simultaneously. A spin-coating method or the like is suitable for forming the quantum dot integrated film 11.

Figure 7D:
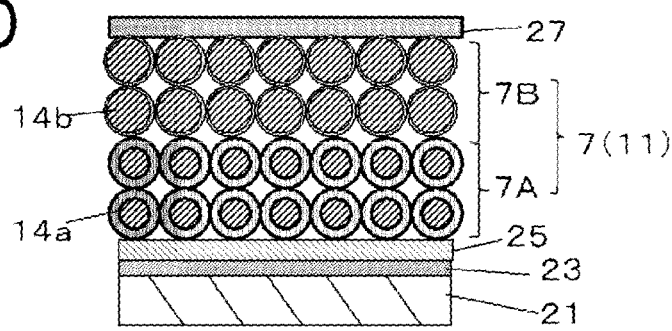

Finally, as illustrated in FIG. 7D, an electrically conductive material such as gold is vapor-deposited on the upper surface side of the quantum dot integrated film 11 to form an electrical conductor film 27 that serves as the electrode layer 3B. Next, as necessary, after forming a protective layer on the surface of the electrical conductor film, the protective layer is covered with a glass film or the like. Through such a process, the photoelectric converter of the first embodiment can be achieved.

Note that when PbS (lead sulfide) is used as the quantum dot 9, the photoelectric converter can be manufactured by a method in which the oleic acid solution of the selected element (Pb) and the sulfur-containing solution (here, Bis (trimethylsilyl) Sulfide solution) are heated to approximately 125° C., and then the resultant is cooled.

When modifying the thickness of the barrier layer 13 formed around the quantum dots 9, organic molecules having different molecular weights are used as organic molecules for forming the barrier layer 13.

As described above, the photoelectric converter of the first embodiment has been described by way of example. However, with respect to the photoelectric converter of the second embodiment that uses quantum dot composite particles 14 in which the components of the barrier layer surrounding the quantum dots has been modified, as described above, different organic molecules such as TBAI and EDT are applied.

In cases of using quantum dots 9 in which the doping components included in the quantum dots 9 are modified, for example, silicon quantum dots 9 doped with elements having different atomic valences or atomic weights are used. Elements included in Group 11 to Group 16 of the periodic table are appropriately selected and applied as doping component elements. In this way, the photoelectric converters of the second embodiment to sixth embodiment can be manufactured in a similar fashion.

REFERENCE SIGNS LIST

1 Photoelectric converter
3A, 3B Electrode layer
5, 7 Semiconductor layer
7A, 7B Quantum dot layer
9 Quantum dot
11 Quantum dot integrated film
13 Barrier layer (ligand component)
$B_C$ Conduction band energy level
$B_V$ Valence band energy level
$E_f$ Fermi level
h Hole
e Electron
$\Delta E$, $\Delta E_1$, $\Delta E_2$ Energy level difference
21 Glass substrate
23 Transparent electrically conductive film
25 Zinc oxide film
27 Electrical conductor film

The invention claimed is:

1. A photoelectric converter comprising:
two semiconductor layers forming a p/n junction as a photoelectric conversion layer,
wherein at least one semiconductor layer of the two semiconductor layers is a quantum dot integrated film, and
the quantum dot integrated film is a p-type and comprises two or greater quantum dot layers having different energy levels with a quantum dot layer having a large difference between an energy level $B_v$ of a valence band and a Fermi level $E_f$ is disposed closer to a surface of the p/n junction.

2. The photoelectric converter according to claim 1,
wherein the quantum dot layer comprises a quantum dot and a barrier layer disposed around the quantum dot, and at least one of a component and a thickness of the barrier layer differs between the two or greater quantum dot layers.

3. The photoelectric converter according to claim 2,
wherein the component of the barrier layer in the two or greater quantum dot layers is inorganic.

4. The photoelectric converter according to claim 2,
wherein the component of the barrier layer in the two or greater quantum dot layers is organic.

5. The photoelectric converter according to claim 1,
wherein the quantum dot comprises an element different from a primary component of the quantum dot, and at least one of an atomic valence of the element and a concentration of the element is different between the two or greater quantum dot layers.

6. A photoelectric converter comprising:
two semiconductor layers forming a p/n junction as a photoelectric conversion layer,
wherein at least one semiconductor layer of the two semiconductor layers is a quantum dot integrated film, and
the quantum dot integrated film is an n-type, a quantum dot layer having a large difference between an energy level BC of a conduction band and a Fermi level $E_f$ is disposed closer to a surface of the p/n junction.

7. The photoelectric converter according to claim 6,
wherein the quantum dot layer comprises a quantum dot and a barrier layer disposed around the quantum dot, and at least one of a component and a thickness of the barrier layer differs between the two or greater quantum dot layers.

8. The photoelectric converter according to claim 7,
wherein the component of the barrier layer in the two or greater quantum dot layers is inorganic.

9. The photoelectric converter according to claim 7,
wherein the component of the barrier layer in the two or greater quantum dot layers is organic.

10. The photoelectric converter according to claim 6,
wherein the quantum dot comprises an element different from a primary component of the quantum dot, and at least one of an atomic valence of the element and a concentration of the element is different between the two or greater quantum dot layers.

* * * * *